United States Patent [19]

Breitzmann et al.

[11] 3,742,384

[45] June 26, 1973

[54] VARIABLE FREQUENCY OSCILLATOR

[75] Inventors: John F. Breitzmann, Richardson; Robert P. Lackey, Plano, both of Tex.

[73] Assignee: Texas Instruments Incorporated, Dallas, Tex.

[22] Filed: June 7, 1971

[21] Appl. No.: 150,498

[52] U.S. Cl. .............. 331/111, 331/108 D, 331/143

[51] Int. Cl. .............................................. H03k 4/50

[58] Field of Search ................. 331/143, 108 D, 111

[56] References Cited

UNITED STATES PATENTS

| | | | |
|---|---|---|---|
| 3,564,455 | 2/1971 | Wedel | 331/143 |
| 3,579,150 | 5/1971 | Badessa | 331/108 D |
| 3,587,001 | 6/1971 | Parchim | 331/111 |
| 3,621,469 | 11/1971 | Bauer | 331/111 |

*Primary Examiner*—John Kominski
*Attorney*—James O. Dixon, Andrew M. Hassell, Harold Levine, Rene E. Grossman and James B. Hinson

[57] ABSTRACT

An oscillator circuit comprising a differential comparator having multiple inputs, an inverter, a reference signal generator for producing a two level reference signal connected to one of said inputs, and a timing signal generator for generating a substantially sawtooth shaped timing signal interconnected to the other of said comparator inputs. The oscillator is substantially free of temperature induced variations or variations induced by changes in the offset voltages of the comparator. The oscillator circuit is particularly advantageous when implemented as an MOS integrated circuit.

9 Claims, 10 Drawing Figures

RESISTORS 58 AND 88
AND/OR 90 HAVE SIMILAR
TEMPERATURE COEFFICIENTS

VARIABLE FREQUENCY OSCILLATOR

DESCRIPTION OF THE INVENTION AND BACKGROUND INFORMATION

Many types of prior art circuits have been used for timing purposes. These prior art circuits range from high stability oscillators to simple RC circuits. Achieving high accuracy using these prior art circuits required use of complicated circuitry such as a crystal controlled oscillator. The complexity of the circuit increased the size and the cost of the timers to a point where these circuits were unsuitable for many applications because of either large size or high cost. Many of the prior art circuits were also subject to variations in the period of the timer due to changes in the voltage source supplying power to the circuit or temperature induced changes in the frequency determining elements.

This invention provides a timer circuit which is substantially free from the above discussed problems. The improved oscillator circuit includes a comparator, a reference signal generator, an inverter and a timing signal generator. The reference signal generator generates a two level reference signal in response to an input signal with the two levels of the reference signal varying in a predetermined manner as a function of temperature and the reference signal generator supply voltage. The timing signal generator generates a substantially sawtooth shaped waveform in response to an input signal with the slope of the sawtooth varying in a predetermined manner as a function of temperature and the timing signal generator supply voltage. The comparator circuit compares the instantaneous value of the reference generator output to the instantaneous value of the timing signal generator output and provides a two level signal to the reference and timing signal generators. Coupled to the output of the comparator is an inverter which generates a two level signal input to the timing and reference signal generators. The polarity of the output signals from the reference signal generator and the timing signal generator are matched such that the output frequency of the oscillator is substantially independent of temperature, changes in the offset voltage of the comparator, and the output voltage of the power supply for these circuits. The output of the oscillator provides a stable time base for generating timing signals. Timing signals having a longer period than the basic cycle of the oscillator can be provided by coupling the output of the oscillator to a counter and decoding the counter output.

An object of the invention is to provide a stabilized oscillator for use in timing applications.

A further object of the invention is to provide an oscillator whose output frequency is substantially free of temperature induced variations.

Another object of the invention is to provide a stable oscillator whose frequency can be adjusted by changing the value of a variable resistor.

Another object of the invention is to provide an oscillator in which the frequency is independent of the amplitude variations in the supply voltage.

Another object of the invention is to provide an oscillator whose stability can be optimized by selecting the ratio of frequency determining resistors.

Another object of the invention is to provide an oscillator which can be easily constructed as an integrated circuit.

Another object of the invention is to provide an oscillator circuit whose frequency is determined by two resistors having a variable ratio.

Another object of the invention is to provide an oscillator circuit, including a comparator, whose frequency is substantially free of errors induced by changes in the offset voltage of said comparator.

These and other objects of the invention will be clear to those skilled in the art in view of the drawings and the following detailed description.

DETAILED DESCRIPTION

Figure 1:
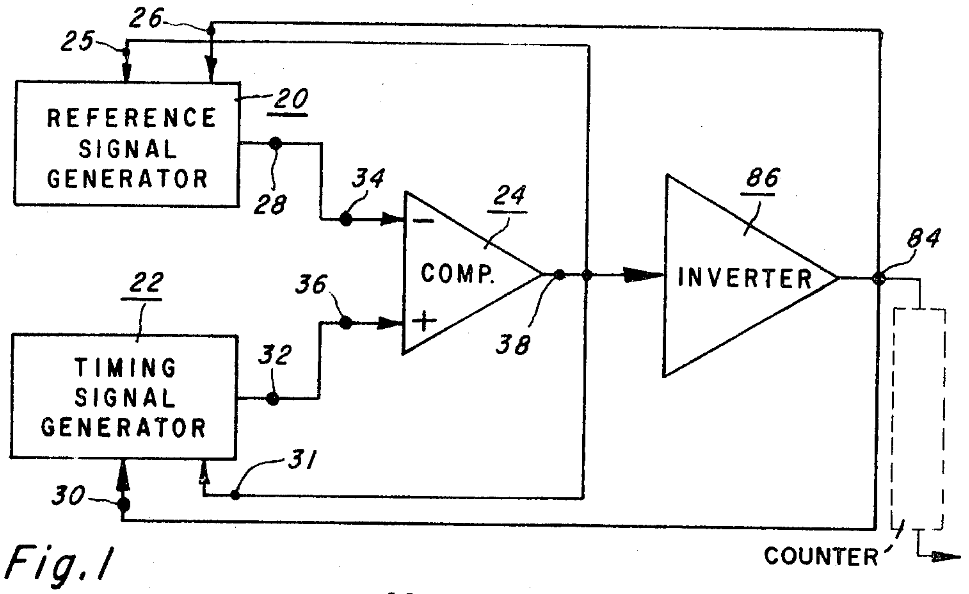
FIG. 1 is a functional diagram of the oscillator circuit.

FIG. 1 is a functional diagram of the oscillator circuit which is the subject of this invention. The oscillator includes a reference signal generator 20, timing signal generator 22, a comparator circuit 24 and an inverter 86. The reference signal generator 20 has two input terminals 25 and 26 and an output terminal 28. The timing signal generator 22 has two input terminals 30 and 31 and output terminal 32. The comparator circuit has two input terminals 34 and 36, and an output terminal 38. The reference signal generator 20, the timing signal generator 22, the comparator circuit 24, and the inverter 86 are interconnected to form an oscillator circuit as shown in FIG. 1.

The comparator 24 is basically a high gain differential amplifier designed such that when the signal coupled to the first, or positive, input terminal 36 is greater than the signal coupled to the second, or negative, input terminal 34, the output signal at terminal 38 of the comparator 24 is high, and when the signal coupled to the first input terminal 36 is lower than the signal coupled to the second input terminal 34 the signal at output terminal 38 is low.

Figure 2:
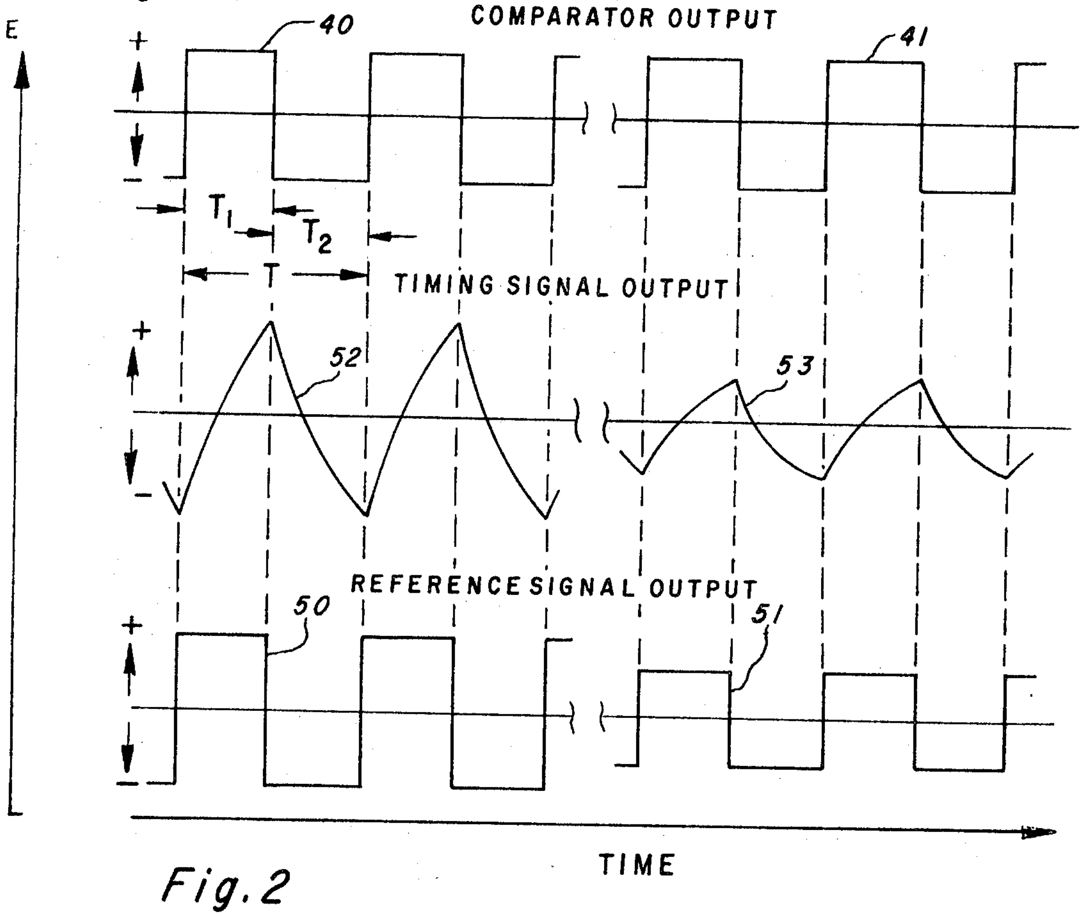
FIG. 2 is a diagram showing the output waveforms of the reference signal generator, the timing signal generator and the output of the comparator at two different temperatures.

The reference signal generator 20 is an electronic circuit which provides a two level reference voltage at its output terminal 28 in response to a two phase input signal coupled to the input terminals 25 and 26. The output of the reference signal generator 20 is high when the signals coupled to terminals 26 and 25 are respectively high and low. The output of the reference signal generator 20 is low when the signals coupled to terminals 26 and 25 are respectively low and high. The output of the reference generator at a first temperature is shown in FIG. 2 generally at the reference 50 and at a second temperature at reference numeral 51. These waveforms have been exaggerated for purposes of illustration.

The timing signal generator 22 is an electronic circuit which provides a substantially sawtooth shaped voltage signal at its output terminal 32 in response to a two phase signal coupled to its input terminals 30 and 31. The output signal of the timing signal generator 22 has a positive slope when the signal coupled to the input terminal 30 and 31 are respectively high and low, and a negative slope when the signals coupled to terminals 30 and 31 are respectively low and high. The general form of the output signal of the timing signal generator at a first temperature is illustrated in FIG. 2 at reference numeral 52 and at a second temperature at reference numeral 53. These waveforms also have been exaggerated for purposes of illustration.

The inverter circuit 86 is an amplifier whose output is high when the input is low and vice versa.

Referring to FIG. 1 it can be seen that the output terminal 84 of the inverter 86 is coupled to the input terminal 30 of the timing generator 22 and also to terminal 26 of the reference signal generator 20. The output terminal 38 of the comparator 24 is coupled to the input terminal 25 of the reference signal generator 20 and to terminal 31 of the timing signal generator 22. The output terminal 28 of the reference generator 20 is coupled to the input terminal 34 of the comparator 24 and the output terminal 32 of the timing signal generator 22 is coupled to the input terminal 36 of the comparator 24. Using this system configuration, the temperature characteristics of the reference generator are predetermined such that with an increase in temperature both the postive and negative values of the reference signal change in a predetermined manner, for example, both values may decrease as illustrated in FIG. 2. The temperature characteristics of the timing signal generator 22 are also predetermined such that the slope change substantially compensates for changes in the oscillator frequency due to changes in the positive and negative values of the output signal of the reference signal generator 20. In the case where the output of the reference signal generator 20 decreases with an increase in temperature, the slope of the output signal of the timing signal generator 22 must also decrease with an increase in temperature. This method of frequency stabilization of the oscillator is preferred over circuits in which an attempt is made to make the reference and timing signal generators essentially free of temperature induced variations because, as shown later, it is relatively easy to make variations in these signals compensate for each other while it is rather difficult to make them independent of temperature induced variations.

The oscillator illustrated in FIG. 1 is also substantially free of frequency changes induced by changes in the offset voltage of the comparator 24. This advantageous feature will be described in detail later.

Figure 3:
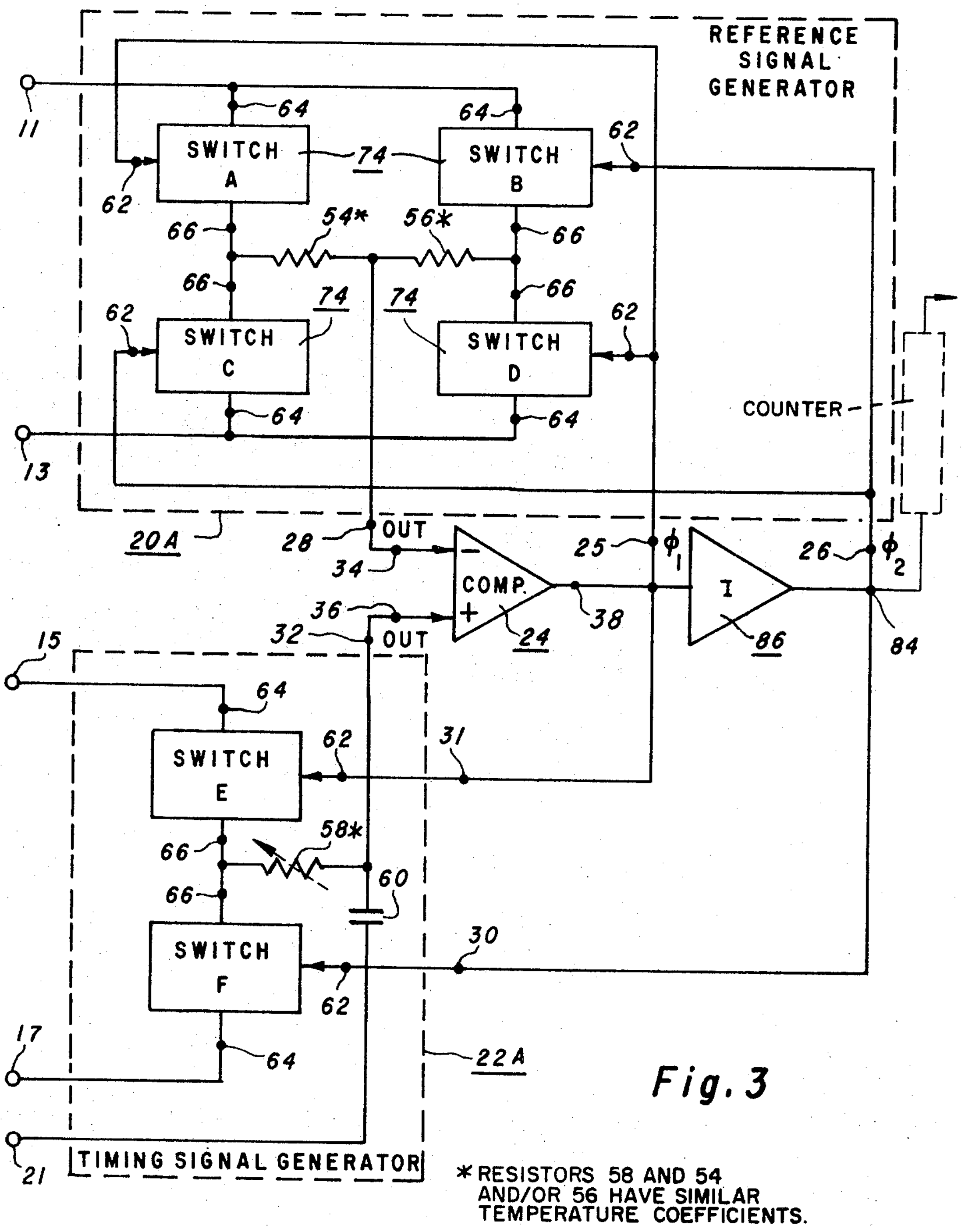
FIG. 3 is a schematic diagram of one embodiment of the invention.

FIG. 3 illustrates another embodiment of the invention. This embodiment utilizes a comparator 24, an inverter 86, a reference signal generator 20A and a timing signal generator 22A. The comparator 24 and the inverter 86 may be identical with the corresponding parts of the previous embodiment.

The reference signal generator 20A consists of two resistors 54 and 56, and four switches A-D. Each of the switches 74 has three terminals, 62, 64 and 66. Each switch is characterized such that when a voltage below (above) a predetermined value is coupled to terminal 62, terminals 64 and 66 are coupled together through a low value resistor. Any voltage more positive (negative) than this predetermined value causes terminals 64 and 66 to be substantially decoupled from each other. There are many circuits which can perform this function, all of which are well known.

Figure 4:
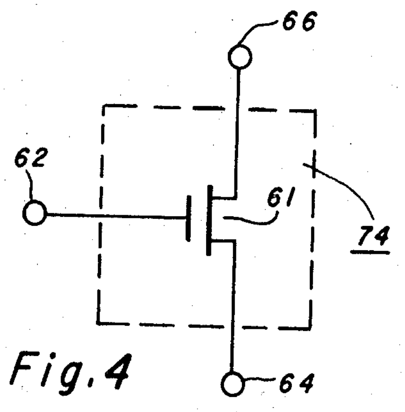
FIG. 4 is a schematic diagram of a MOS switching circuit.

One embodiment of a typical switching circuit 74 which is particularly advantageous is illustrated in FIG. 4. This switch comprises a single MOS transistor 61 having a gate terminal 62 and source and drain terminals 64 and 66 which are interchangeable. In practice the two circuit elements to be coupled together by the switch 74 are connected to the drain and source terminals, 66 and 64 and the gate terminal 62 is coupled to a signal having two values so as to selectively switch the transistor 61 from its high to its low resistance states. The exact signal requirements will depend on the particular MOS transistor used and other circuit details. The operational requirements of MOS transistors in the switching mode are well known and will not be described.

The aforementioned switching circuit is only one example of useable switching circuits. Other circuits using either MOS or bipolar devices or some combination of the two are also useable. Mechanical switches, such as reed relays, may also be used in low frequency applications.

The switches are characterized by having an input terminal to which a two level signal is applied. For one level of the input signal, the other two terminals are coupled together through a low resistance path, and for the other level of the input signal, the two terminals are either not coupled together at all or through a very high resistance.

As shown in FIG. 3, the common connection between first and second resistors 54 and 56 is coupled to the output terminal 28 of the reference signal generator 20A. Terminals 66 of switches A and C are common and connected to the other side of first resistor 54. Similarly, terminals 66 of switches B and D are common and connected to the other side of second resistor 56. Terminals 64 of switches A and B are connected together and to a first reference terminal 11. Similarly, terminals 64 of switches C and D are connected together and to a second reference terminal 13. Output terminals of the comparator 24 and the inverter 86 are respectively coupled to terminals 62 of switches A and D and switches B and C. Since by definition when the output of the comparator 20A is high, the output of the inverter 86 is low and vice versa, this arrangement respectively couples the second terminal of the first resistor 54 to the second reference terminal 13 for one value of the output signal and to the first reference terminal 11 for the second value of the output signal. The second terminal of the second resistor 56 is similarly coupled by switches B and D to the first and second reference terminals, 11 and 13. The polarities of the signals coupled to terminals 62 of the switches are such that when the second terminal of the first resistor 54 is coupled to the first reference terminal 11, the second terminal of the second resistor 56 is coupled to the second reference terminal 13 and vice versa. By coupling the first and second reference terminals, 11 and 13, to first and second reference voltage signals of different magnitude, and choosing different value resistors for the first and second resistors, switching the two resistors in the beforementioned manner generates a two valued reference signal at the output terminal 28 of reference signal generator 20A.

The timing signal generator 22A consists of two switching circuits, E and F, a resistor 58 which may be variable resistor, and a capacitor 60. A first terminal of the resistor 58 and a first terminal of the capacitor 60 are connected together and to the output terminal 32 of the timing signal generator 22A. Terminals 66 of switches E and F are connected together and to the second terminal of the resistor 58. The second terminal of the capacitor 60 is coupled to a fifth reference terminal 21 while terminals 64 of switches E and F also are respectively coupled to third and fourth reference terminals, 15 and 17. Terminals 62 of switches E and F are respectively coupled to the output terminal 38 of the comparator 24 and the output terminal 84 of the inverter 86. By connecting the fourth and fifth reference terminals, 17 and 21, together and to a third reference voltage and coupling a fourth reference voltage to the fourth reference terminal 15, and choosing voltage sources having a different value for these reference sources, switches E and F will switch one terminal of the resistor 58 back and fourth between these voltages and generate a substantially sawtooth shaped voltage signal at the output terminal 32 of the timing signal generator 22A.

Coupling the output terminal 28 of the reference signal generator 20A to the negative input terminal 34 of the comparator 24 and the output of terminal 32 of the timing signal generator 22A to the positive input terminal 36 of the comparator 24 completes the circuit. The complete circuit will generate the reference signal, the timing signal and the output signals illustrated generally in FIG. 2.

The output frequency of the above described circuit can be made independent of the voltage signals coupled to the various reference terminals by coupling reference terminals 11 and 15 together and to a first reference signal and coupling the third and fourth reference terminals 13 and 17 together and to a second reference voltage signal. Reference terminal 21 may be coupled to either the first or second reference voltage signal. A separate voltage signal may also be applied to fifth reference terminal 21 to dynamically change the frequency of the oscillator in response to an external signal.

Figure 5:
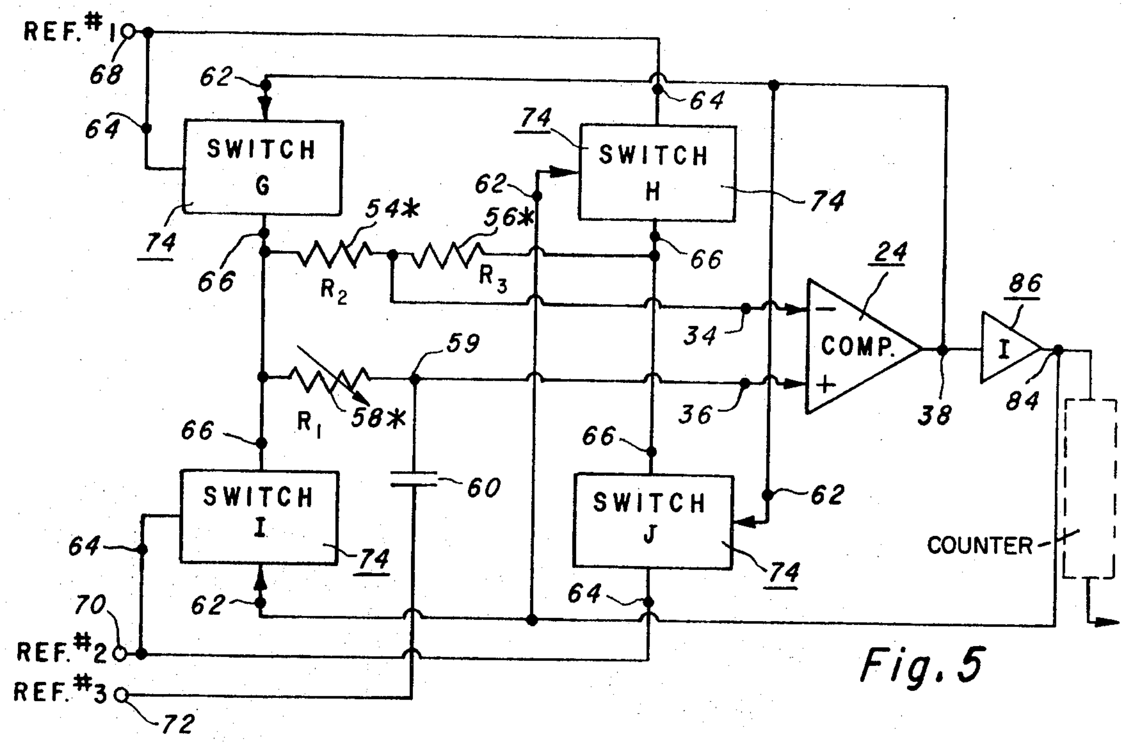
FIG. 5 is a schematic diagram of a second embodiment of the invention.

FIG. 5 shows another embodiment of the invention. In this embodiment the two level reference signal is generated by alternately switching a resistance network comprised of two series connected resistors, 54 and 56, between two reference terminals 68 and 70 to which first and second reference voltages are respectively coupled. The first terminals of the two resistors are connected together and to the negative terminal 34 of the comparator 24. The second terminal of the resistor 54 is coupled to terminal 66 of switches G and I and the second terminal of resistor 56 is coupled to terminal 66 of switches H and J. The timing signal is generated by a series RC network consisting of a capacitor and a resistor. First and second terminals of the capacitor 60 are respectively coupled to a reference terminal 72 and to a first terminal of a resistor 58. The junction of the capacitor 60 and the resistor 58 forms the output terminal 59 of the timing signal generator. The second terminal of the resistor 58 is alternately switched between first and second reference terminals 68 and 70 by switches G and I. The aforementioned switching functions are performed by four switching circuits all of which may be identical. To distinguish between the various identical switching circuits, they have been labeled G, H, I and J in FIG. 5.

By coupling the first reference terminal 68 to a first reference voltage and coupling the second reference terminal 72 to a second reference voltage, with the two voltages being substantially different in amplitude, and alternately switching the second terminal of the resistor 58 between these two references, a substantially sawtooth shaped timing signal is generated. This timing signal is coupled to the positive input terminal 36 of the comparator 24 by connecting the junction of the resistor 58 and the capacitor 60 to this terminal. Terminals 62 of switches G and J are coupled to the output terminal 38 of the comparator. Terminals 62 of switches H and I are coupled to the output terminal 84 of the inverter 86. Each of the switches G, H, I and J are designed such that the switches are in a highly conductive state when the input signal coupled to terminal 62 is low and highly nonconductive when this signal is high. Since the output signals of both the comparator 24 and the inverter 86 are two level signals, either switches G and J or H and I will always be conducting. This being the case, the series resistor network comprising two resistors 54 and 56 and the timing network comprising a cpacitor 60 and a resistor 58 will be switched in the aforementioned manner to generate the two level reference signal and the sawtooth shaped timing signal.

The circuit illustrated in FIG. 5 can be developed from the circuit shown in FIG. 3 by combining the function of switch A with switch E and combining the function of switch F with switch C. This also requires connecting the first reference terminal 11 with the third reference terminal 15 and the second reference terminal 13 with the fourth reference terminal 17. As previously discussed, connecting the reference terminals in the aforementioned manner makes the oscillator frequency independent of the reference voltages coupled to these terminals. After the reference terminals are so connected, it can easily be seen how the aforementioned switches can be combined and the circuit of FIG. 3 can be simplified to the circuit illustrated in FIG. 5.

Figure 6:
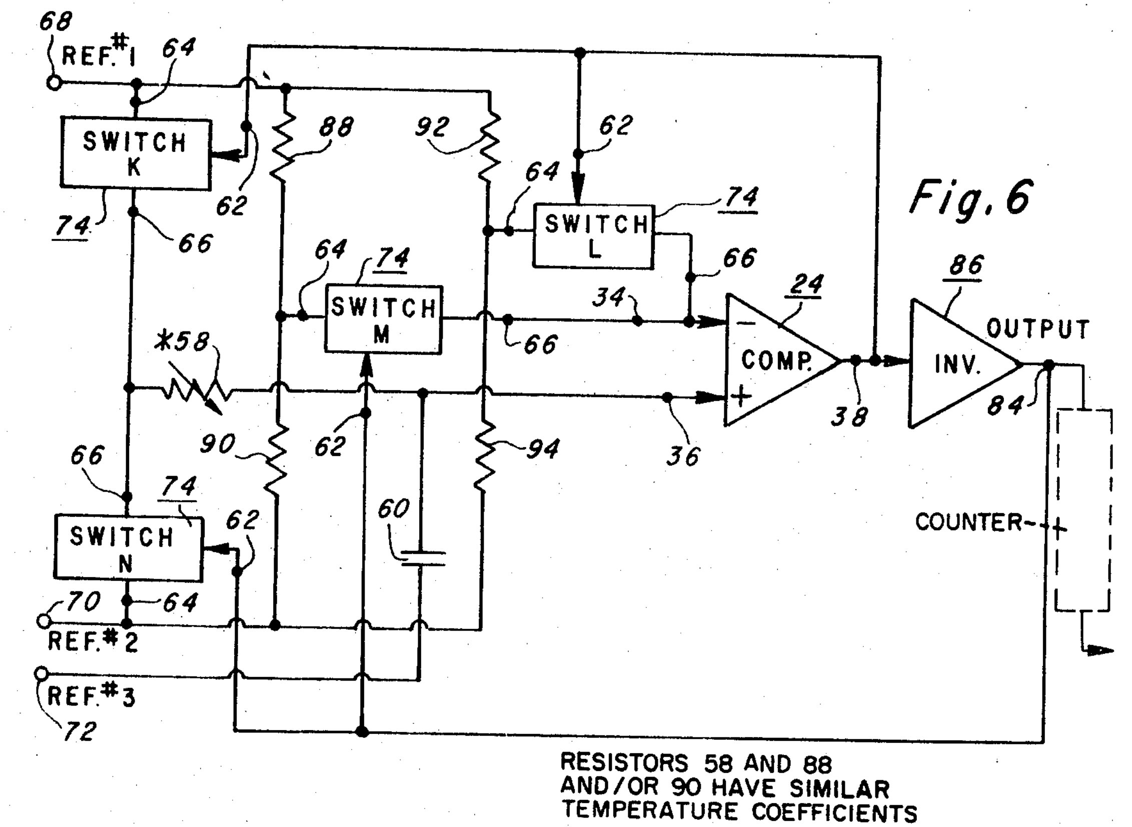
FIG. 6 is a schematic diagram of a third embodiment of the invention.

Another embodiment of the invention is illustrated in FIG. 6. This embodiment uses the switching circuits 74, the comparator 24 and the inverter circuit 86 discussed in the previous embodiment. The timing network consisting of a resistor 58 in series with a capacitor 60 is also substantially the same as the timing network used in the previous embodiment. The output terminal 84 of the inverter 86 is coupled to terminals 62 of switches M and N. The output terminal 38 of the comparator 24 is coupled to terminals 62 of switches K and L. A first value of the two valued reference signal is generated by a resistor divider network consisting of two series connected resistors, 88 and 90, coupled between a first reference voltage terminal input 68 and the second reference voltage input terminal 70. The second level of the two valued reference signal is generated by a second similar voltage divider network consisting of two series connected resistors, 92 and 94, coupled between the same reference voltage terminals. Switches L and M alternately couple the output of these voltage divider networks to the negative input terminal 34 of the comparator 24. The junction of the resistor 58 and the capacitor 60, forming the timing network, is coupled to the positive input terminal 36 of the comparator 24. The other terminal of resistor 58 is alternately coupled to first and second reference voltage input terminals, 68 and 70, by switches K and N. By coupling a positive reference voltage to the first reference voltage input terminal 68 and a negative voltage to the second reference voltage terminal 70, the circuit will oscillate and generate the waveforms as indicated in FIG. 2.

Figure 7:
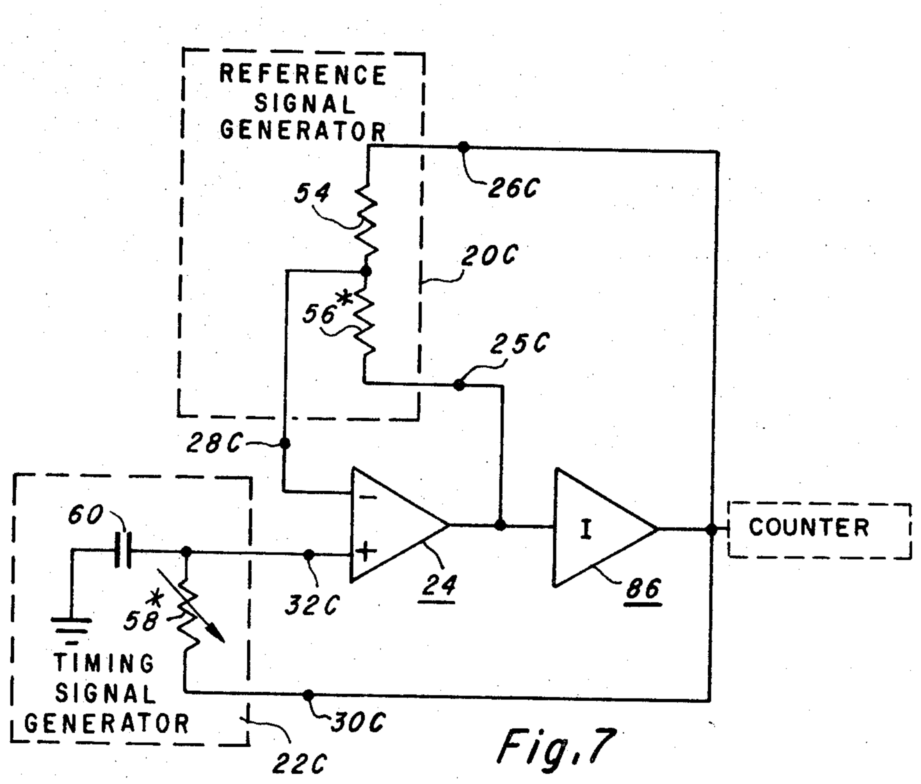
FIG. 7 is a fourth embodiment of the invention.
Figure 8:
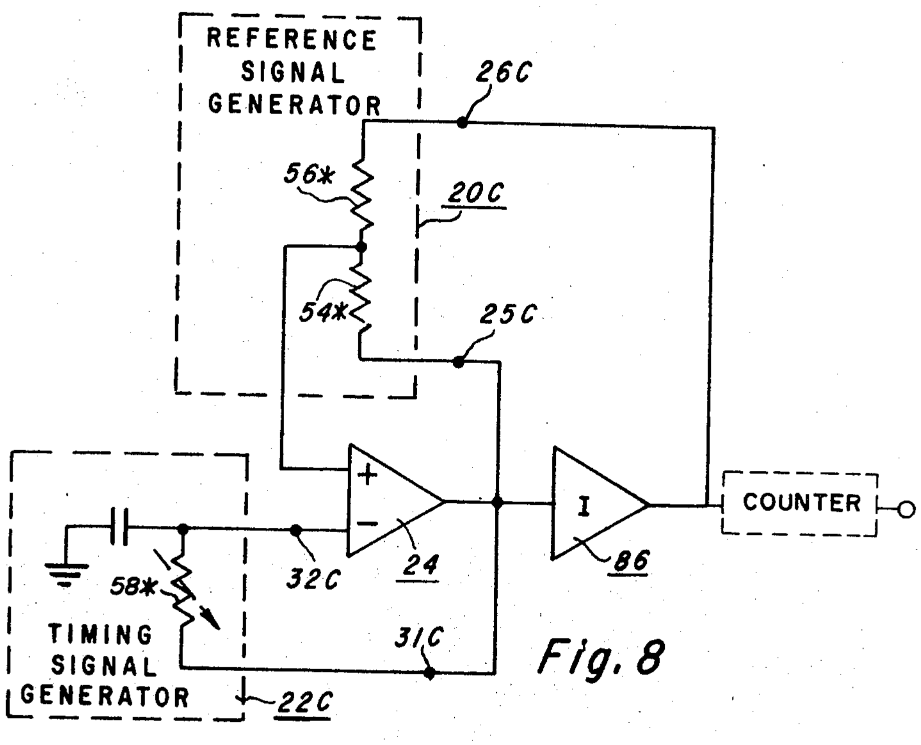
FIG. 8 is a modified version of the oscillator circuit illustrated in FIG. 7.

Another embodiment of the invention is illustrated in FIG. 7. This embodiment consists of a comparator, an inverter, a reference signal generator and a timing signal generator. This embodiment can most easily be developed from the embodiment illustrated in FIG. 5 by observing that if the output impedance of the comparator 24 and the inverter 86 is sufficiently low that the switches are unnecessary. This reduces the two level reference generator to the two series connected resistors, 54 and 56 shown in FIG. 7. The two resistors are series connected between the output terminals of the inverter and the comparator with the junction of the two resistors coupled to the negative input terminal of the comparator. The timing signal generator is reduced to a series RC network coupled between circuit ground and the output of the inverter. The junction of the capacitor and the resistor forms the output terminal of the timing signal generator and is coupled to the positive input terminal of the comparator. The circuit of FIG. 7 may be modified by interchanging the inputs to the comparator 24, coupling the timing signal generator to the output of the comparator 24 rather than the output of the inverter 86, and interchanging the position of the threshold determining resistors 54 and 56 in the reference signal generator. The modified circuit is shown in FIG. 8.

In each of the preceding embodiments reference terminals 70 and 72 may be connected together. Alternately reference terminal 72 can be coupled to an independent voltage source to dynamically modify the output of the timing signal generator. This may be particularly advantageous when it is desired to synchronize the oscillator with an external signal.

From the preceeding discussion of the operation of the circuit it is obvious that if the difference between the positive and negative values of the reference signal increase without a corresponding change in the slope of the waveform generated by the timing signal generator the frequency of the oscillator will decrease while if the slope of the signal generated by the timing signal generator increases without any changes in the difference between the positive and negative values of the reference generator the frequency of the oscillator will increase. By choosing a capacitor for the timing network and resistors having properly matched temperature coefficients for use in the timing signal and reference voltage generators, the amplitude of the reference signals and the slope of the timing signal can be compensated such that the frequency of the oscillator is essentially free of variations due to temperature. The following are calculations for the frequency of the oscillator circuit shown in FIG. 5. These calculations show that the output frequency of the oscillator is independent of the amplitude of the reference voltage. They also illustrate how the frequency of the oscillator can be made variable and substantially free of temperature induced variations by including resistors having similar temperature coefficients in the timing and reference signal networks.

In the following equations the various terms of the equations have the following relationship to the components illustrated in FIG. 5.

$R_1$ is identified by reference numeral 58.

$R_2$ is identifed by reference numeral 54.

$R_3$ is identified by reference numeral 56.

C is identified by reference numeral 60.

The period of the oscillator circuit (T) illustrated in FIG. 5 is given by the following equations:

$T_1 = R_1 C\, ln\, (R_3/R_2)$ $T_2 = R_1 C\, ln\, (R_3/R_2)$ $T = T_1 + T_2 = 2R_1 C\, ln\, (R_3/R_2)$ where $T_1$, $T_2$ and $T$ are defined in FIG. 2.

By assuming that a change in temperature causes changes in $R_1$, $R_2$, $R_3$ and C such that:

$R_1 = R_1 + \Delta R_1$ $R_2 = R_2 + \Delta R_2$ $R_3 = R_3 + \Delta R_3$ $C = C + \Delta C$ then the new period of oscillation (I') is given by, $$T' = 2(R_1 + \Delta R_1)(C + \Delta C) ln\, [(R_3 + \Delta R_3)/(R_2 + \Delta R_2)]$$

The change in period due to changes in $R_1$, $R_2$, $R_3$ and C over temperature ($\Delta T'$) is given by:

$$\Delta T' = T' - T = 2\, [\Delta R_1 C + R_1 \Delta C]\, ln\, (R_3/R_2) - 2R_1 C\, [(\Delta R_2/R_2) - (\Delta R_3/R_3)]$$

This change given as a percentage error (E') is:

$$E' = \frac{100 \Delta T'}{T} = 100 \left[ \frac{\Delta C}{C} + \frac{\Delta R_1}{R_1} + \frac{\Delta R_3}{R_3 \ln} \left( \frac{R_3}{R_2} \right) - \frac{\Delta R_2}{R_2 \ln} \left( \frac{R_3}{R_2} \right) \right]$$

In variable frequency oscillator applications, $R_1$ will be generally a deposited resistance element.

Since it is extremely difficult using the current technology to make resistors which are both variable and have a very low temperature coefficient it is desired to eliminate the effects of a change in $R_1$ ($\Delta R_1$) on the percent period change E'. Assume that the fixed resistor $R_2$ which is part of the reference signal generator is made of the same material as variable resistor $R_1$ which is part of the timing signal generator. Then $(\Delta R_1/R_1) = (\Delta R_2/R_2)$ and the equation for E' becomes:

$$E' = 100 \left\{ \frac{\Delta C}{C} + \frac{\Delta R_3}{R_3 ln} \left( \frac{R_3}{R_2} \right) + \frac{\Delta R_1}{R_1} \left[ 1 - \frac{1}{\ln \left( \frac{R_3}{R_2} \right)} \right] \right\}$$

If $R_3 = 2.72\, R_2$ then $ln(R_3/R_2) = 1$ and $E' = 100[(\Delta C/C) + (\Delta R_3/R_3)]$ Current state of the art allows $\Delta C$ and $\Delta R_3$ to be as small as desired thus making the change in oscillator period virtually independent of temperature.

Inspection of the above equation also indicates that the frequency of the oscillator is independent of the reference voltage. A circuit having this characteristic is particularly advantageous for use in environments wherein the voltage output of the power source may vary.

Figure 9:
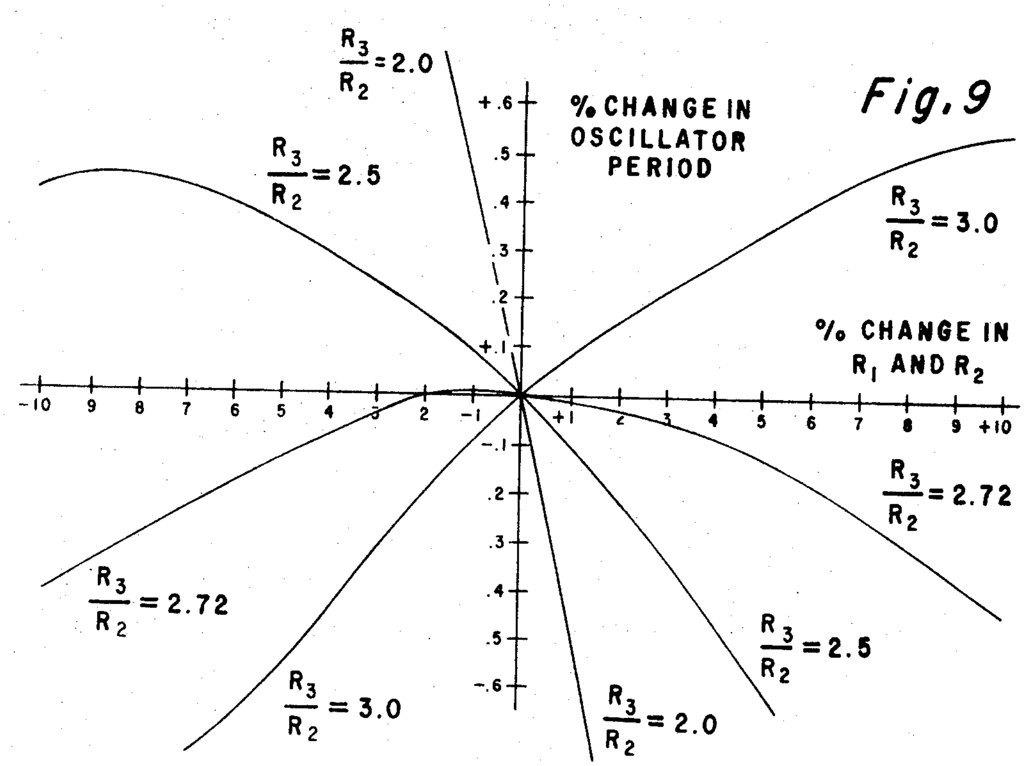
FIG. 9 is a diagram showing how the frequency stability of the oscillator can be optimized by the proper selection of the resistance ratio forming the voltage divider network of the reference signal generator.

FIG. 9 shows the experimental errors for various ratios of $R_3$ and $R_2$. It should be noted from these curves that if the ratio is 2.72, the optimum value as indicated by the above calculations, that the error introduced by changes in the resistors of plus or minus 10 percent results in 0.5 percent error in the period of the oscillator outputs.

Figure 10:
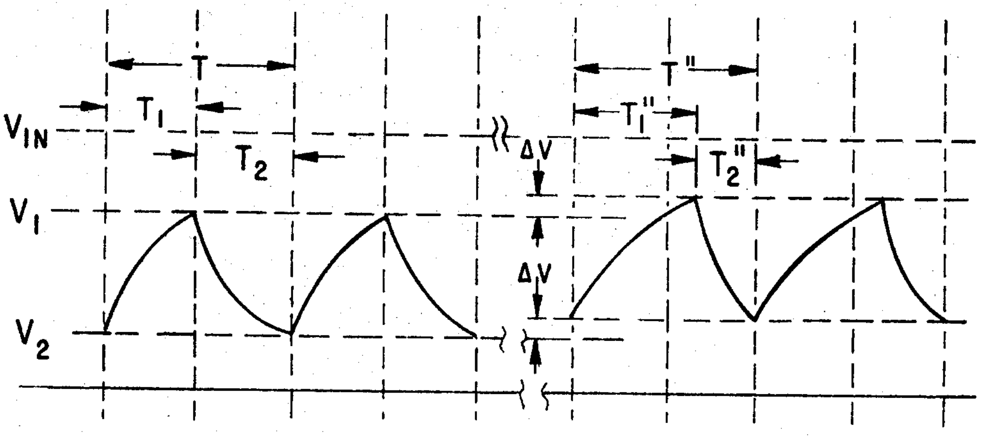
FIG. 10 illustrates the change in the timing signal generator as a result of a change in the offset voltage of the comparator.

The circuit in FIG. 5 also substantially eliminates the error in the output frequency due to changes in the offset voltage of the comparator. This can be seen by the following equations where $V_1$, $V_2$, $V_{IN}$, $\Delta V$, T, $T_1$, $T_2$, T'', $T_1''$ and $T_2''$ are shown in FIG. 10. Various terms of the equations have the following relationship to the components illustrated in FIG. 5.

$R_1$ is identified by reference numeral 58.

$R_2$ is identified by reference numeral 54.

$R_3$ is identified by reference numeral 56.

C is identified by reference numeral 60.

$V_{IN}$ is defined as the voltage present at reference terminal 68 minus the voltage present at reference terminal 70.

$$V_1 = R_3 V_{IN}/(R_2 + R_3)$$
$$V_2 = R_2 V_{IN}/(R_2 + R_3)$$
$$T_1 = R_1 C \ln (V_1/V_2)$$
$$T_2 = R_1 C \ln (V_1/V_2)$$
$$T = T_1 + T_2 = 2R_1 C \ln(V_1/V_2) = R_1 C \ln (V_1^2/V_2^2)$$
$$T_1'' = R_1 C \ln [(V_{IN} - V_2 - \Delta V)/(V_{IN} - V_1 - \Delta V)]$$
$$T_2'' = R_1 C \ln [(V_{IN} - V_2 + \Delta V)/(V_{IN} - V_1 + \Delta V)]$$
$$T'' = T_1'' + T_2'' = R_1 C \ln [(V_1^2 - \Delta V^2)/(V_2^2 - \Delta V^2)]$$

Clearly the expression for the total period of oscillation after a change in the comparator input offset characteristics T'' is almost identical, to the expression obtained assuming zero offset, differing only by second order effects. This can be seen from FIG. 10 observing that $T_1''$ changes but $T_2''$ changes in exactly the opposite manner to render T'' unchanged.

A counter can also be coupled to the output of the oscillator to generate timing signals having a period longer than the basic cycle time of the oscillator.

The foregoing timers are particularly advantageous when it is desired to construct the timers as integrated circuits because all components of the oscillator can be easily implemented using MOS circuits. This greatly reduces the cost and power consumption of the finished timer. The timer can also be implemented as a bipolar integrated circuit.

The reduced error due to offset voltages in the comparator permits the comparator circuit to be easily constructed using MOS integrated circuits. Considering the current state of the art, this usually reduces cost and improves reliability of the oscillator.

Although the above calculations apply only to the circuit of FIG. 5, it can be shown that the other illustrated embodiments have these desirable features.

Although the invention has been described and defined with reference to preferred embodiments, it will be obvious to those skilled in the art that many changes could be made without departing from the scope of the invention as described and defined herein.

What is claimed is:

1. An oscillator circuit comprising in combination:

a. a differential comparator having multiple inputs for comparing first and second signals and for generating an output signal having first and second values, said first value being generated when said first signal exceeds said second signal and said second value being generated when said second signal exceeds said first signal, said output signal being selectively coupled to first and second switching circuits;

b. an inverter circuit coupled to the output of said comparator, the output of said inverter being selectively coupled to third and fourth switching circuits;

c. a voltage divider network coupled to a first input of said comparator, and to said switching circuits such that selective activation of said switching circuits selectively couples said voltage divider network to first and second reference voltages thereby generating a two valued reference at said first input of said comparator;

d. a timing network coupled to a second input of said comparator and to said switching circuits such that selective activation of said switching circuits selectively couples said timing network to first and second reference voltages thereby generating a sawtooth timing signal at said second input of said comparator.

2. The oscillator circuit of claim 1 wherein said voltage divider network comprises two series connected resistors.

3. The oscillator circuit of claim 1 wherein said timing circuit comprises a resistor and a capacitor connected in series.

4. The oscillator circuit of claim 3 wherein said resistor is variable.

5. The oscillator circuit of claim 2 wherein at least one of the resistors of said voltage divider network and at least one resistor in said timing network have similar temperature coefficients, such that said oscillator is substantially free of frequency variations due to temperature changes.

6. The oscillator of claim 2 wherein said timing circuit includes a resistor and at least one resistor in said voltage divider network and said resistor in said timing circuit have similar temperature coefficients and the ratio of the voltage divider resistors is approximately 2.72.

7. A high stability oscillator circuit having a temperature compensation characteristic comprising:

a. a resistance network including a pair of series connected resistors, one of said resistors having a known temperature coeffcient;

b. first and second reference signal sources;

c. switching means for alternately connecting the resistance network to the first and second reference signals;

d. a comparator having a first input terminal operatively connected to terminals common to the pair of series connected resistors of the resistance network;

e. a RC timing network including a resistor coupled to a capacitor, said resistor having a temperature coefficient substantially equal to that of the resistance network resistor of known temperature coefficient;

f. switching means for alternately connecting the RC timing network to the first and second reference signal sources;

g. a second input terminal of said comparator operatively connected to terminals common to the resistor and capacitor of said RC network; and h. first and second feedback networks coupled to the output of the comparator for producing signals of opposite polarity to selectively energize switches of the switching means for the resistance network and for the RC timing network for generating a two level reference signal and a sawtooth shaped timing signal for the comparator whereby the output frequency of the oscillator is substantially free of temperature induced variations.

8. A high stability oscillator circuit according to claim 7 wherein said resistors of the voltage divider of the reference generator have ohmic values in the ratio substantially equal to 2.72.

9. A high stability oscillator circuit according to claim 7 wherein said resistor of the R-C circuit of the timing signal generator is a variable resistor to provide a variable frequency oscillator whose frequency is independent of the reference voltage.

* * * * *